(12) United States Patent
Dargis et al.

(10) Patent No.: US 11,757,008 B2
(45) Date of Patent: Sep. 12, 2023

(54) ELECTRONIC DEVICE WITH 2-DIMENSIONAL ELECTRON GAS BETWEEN POLAR-ORIENTED RARE-EARTH OXIDE LAYER GROWN OVER A SEMICONDUCTOR

(71) Applicant: IQE plc, Cardiff (GB)

(72) Inventors: Rytis Dargis, Greensboro, NC (US); Andrew Clark, Mountain View, CA (US); Richard Hammond, Newport (GB); Rodney Pelzel, Bethlehem, PA (US); Michael Lebby, Apache Junction, AZ (US)

(73) Assignee: IQE plc, Cardiff (GB)

( * ) Notice: Subject to any disclaimer, the term of this patent is extended or adjusted under 35 U.S.C. 154(b) by 193 days.

(21) Appl. No.: 16/969,794

(22) PCT Filed: Feb. 15, 2019

(86) PCT No.: PCT/IB2019/000158
§ 371 (c)(1),
(2) Date: Aug. 13, 2020

(87) PCT Pub. No.: WO2019/159001
PCT Pub. Date: Aug. 22, 2019

(65) Prior Publication Data
US 2021/0005720 A1    Jan. 7, 2021

Related U.S. Application Data

(60) Provisional application No. 62/631,163, filed on Feb. 15, 2018.

(51) Int. Cl.
H01L 29/267    (2006.01)
H01L 29/40     (2006.01)
H01L 29/778    (2006.01)

(52) U.S. Cl.
CPC .......... H01L 29/267 (2013.01); H01L 29/408 (2013.01); H01L 29/7787 (2013.01)

(58) Field of Classification Search
CPC . H01L 29/267; H01L 29/408; H01L 29/7787; H01L 21/02609; H01L 21/02433;
(Continued)

(56) References Cited

U.S. PATENT DOCUMENTS 8,846,504 B1    9/2014   Dargis et al.
2006/0060131 A1*  3/2006  Atanackovic ........... H01L 33/34
                                                257/E21.274
(Continued)

FOREIGN PATENT DOCUMENTS

WO    WO 2017210622    12/2017

Primary Examiner — Julio J Maldonado
Assistant Examiner — Mohammad A Rahman
(74) Attorney, Agent, or Firm — Sterne, Kessler, Goldstein & Fox P.L.L.C.

(57) ABSTRACT

Layered structures described herein include electronic devices with 2-dimensional electron gas between polar-oriented cubic rare-earth oxide layers on a non-polar semiconductor. Layered structure includes a semiconductor device, comprising a III-N layer or rare-earth layer, a polar rare-earth oxide layer grown over the III-N layer or rare-earth layer, a gate terminal deposited or grown over the polar rare-earth oxide layer, a source terminal that is deposited or epitaxially grown over the layer, and a drain terminal that is deposited or grown over the layer.

27 Claims, 15 Drawing Sheets

1100

(58) Field of Classification Search
CPC ........... H01L 21/02516; H01L 21/0254; H01L 21/02565; H01L 21/02381; H01L 21/02491; H01L 21/02502; H01L 21/0237; H01L 21/02389; H01L 21/02483; H01L 29/66848–66886; H01L 29/66257; H01L 29/66962; H01L 29/7308; H01L 29/8126; H01L 31/1123; H01L 29/0891; H01L 27/095; H01L 2924/13052; H01L 2924/13063; H01L 29/04–045; H01L 29/16–1608; H01L 29/18–185; H01L 29/22–2206; H01L 29/36–365

See application file for complete search history.

(56) References Cited

U.S. PATENT DOCUMENTS

| | | | |
|---|---|---|---|
| 2014/0239307 A1* | 8/2014 | Dargis | H01L 21/02433 117/108 |
| 2015/0069409 A1* | 3/2015 | Dargis | H01L 21/02516 438/479 |
| 2015/0125976 A1* | 5/2015 | Wang | C30B 29/38 438/479 |
| 2015/0203990 A1 | 7/2015 | Rytis et al. | |
| 2017/0141750 A1 | 5/2017 | Rodney et al. | |

* cited by examiner

800

ELECTRONIC DEVICE WITH 2-DIMENSIONAL ELECTRON GAS BETWEEN POLAR-ORIENTED RARE-EARTH OXIDE LAYER GROWN OVER A SEMICONDUCTOR

CROSS REFERENCE TO RELATED APPLICATION

This disclosure claims the benefit under 35 U.S.C. § 119(e) of U.S. Provisional Application No. 62/631,163, filed Feb. 15, 2018, which is hereby incorporated by reference herein in its entirety.

FIELD OF USE

This application relates to integrating various semiconductor devices over a layered structure of a polar-oriented rare-earth oxide layer grown over another semiconductor layer.

BACKGROUND

The dielectric permittivity of non-polar rare-earth oxide (REO) layers is usually limited to a range of 12 to 14. The low dielectric permittivity limits the thickness of non-polar rare-earth oxide layers. The limitation on the thickness of the non-polar rare-earth oxide layers increases current leakage and thus does not allow for growth of an efficient electronic devices over the non-polar rare-earth oxide layer. Thus, conventional methods do not allow for the formation of efficient electronic devices with two-dimensional electron gas (2DEG) over III-N layers with a non-polar orientation.

Polar REO layers demonstrate higher dielectric permittivity. Increased dielectric permittivity would be beneficial because it allows the growing of thicker field-effect transistor (FET) gate layers while maintaining the same equivalent oxide thickness and decreasing leakage current.

SUMMARY

Layered structures described herein include devices with 2DEG between polar-oriented rare-earth oxide layers on a III-N layer. In some embodiments, the orientation of the III-N layer is non-polar or semi-polar. In some embodiments, the layered structure further comprises a rare-earth silicide layer grown over the polar rare-earth oxide layer. In some embodiments, the layered structure further comprises an epitaxial metal layer epitaxially grown over the polar rare-earth oxide layer.

In some embodiments, the polar rare earth oxide layer of the layered structure has at least a first portion of electrons that diffuse to an interface between the polar rare-earth oxide layer and the III-N layer or are transferred to the III-N layer to form an n-type 2-dimensional electron gas (2DEG) on the III-N layer. In some embodiments, the III-N layer and the polar rare-earth oxide layer are selected to yield a conduction band offset between the III-N layer and the polar rare-earth oxide layer that is sufficient for electrons to diffuse from the polar rare-earth oxide layer into the III-N layer.

In some embodiments, the layered structure further comprises a group IV substrate, an epi-twist rare-earth oxide layer over the group IV substrate, and wherein the III-N layer is over the epi-twist rare earth oxide layer. In some embodiments, the layered structure further comprises an epitaxial metal layer between the epi-twist rare-earth oxide layer and the III-N layer. In some embodiments, the III-N layer of the layered structure comprises of gallium nitride.

Layered structure includes a semiconductor device, comprising a III-N layer, a polar rare-earth oxide layer grown over the III-N layer, a gate terminal deposited or grown over the polar rare-earth oxide layer, a source terminal that is deposited or epitaxially grown over the layer, and a drain terminal that is deposited or grown over the layer. In some embodiments, the gate terminal of the semiconductor device includes rare earth silicide or an epitaxial metal element. In some embodiments, the semiconductor device further comprises a silicon dioxide layer between the polar rare-earth oxide layer and the gate terminal.

In some embodiments, the semiconductor device further comprises a silicon substrate; an epi-twist rare-earth oxide layer over the silicon substrate, and wherein the III-N layer is over the epi-twist rare earth oxide layer. In some embodiments, the III-N layer of the semiconductor device aligns with a first region on the epi-twist rare-earth oxide layer, and the layered structure further comprises a second III-N layer over a second region on the epi-twist rare-earth oxide layer, wherein the first region and the second region are non-overlapping. In some embodiments, the layered structure further comprises a transparent electrode over a first sub-region of the second III-N layer, and an electrode over a second sub-region of the III-N layer, wherein the second III-N layer, the transparent electrode and the electrode form a photonic device.

In some embodiments, the first region of the epi-twist rare-earth oxide layer and the second region of the epi-twist rare-earth oxide layer of the semiconductor device are discontinuous. In some embodiments, the semiconductor device further comprises a silicon device integrated into the silicon substrate at a third region between the first region of the epi-twist rare-earth oxide layer and the second region of the epi-twist rare-earth oxide layer. In some embodiments, the semiconductor device further comprises an element that comprises a rare-earth pnictide over the silicon substrate at the third region between the first region of the epi-twist rare-earth oxide layer and the second region of the epi-twist rare-earth oxide layer, and a III-V device over the rare-earth pnictide element.

Layered structures described herein include devices with 2DEG between polar-oriented cubic rare-earth oxide layers on a RE-N semiconductor. In some embodiments, the orientation of the RE-N layer is non-polar or semi-polar. In some embodiments, the layered structure further comprises a rare-earth silicide layer grown over the polar rare-earth oxide layer. In some embodiments, the layered structure further comprises an epitaxial metal layer epitaxially grown over the polar rare-earth oxide layer.

In some embodiments, the polar rare earth oxide layer of the layered structure has at least a first portion of electrons that diffuse to an interface between the polar rare-earth oxide layer and the RE-N layer or are transferred to the RE-N layer to form an n-type 2-dimensional electron gas (2DEG) on the RE-N layer. In some embodiments, the RE-N layer and the polar rare-earth oxide layer are selected to yield a conduction band offset between the RE-N layer and the polar rare-earth oxide layer that is sufficient for electrons to diffuse from the polar rare-earth oxide layer into the III-N layer.

In some embodiments, the layered structure further comprises a group IV substrate, an epi-twist rare-earth oxide layer over the group IV substrate, and wherein the RE-N layer is over the epi-twist rare earth oxide layer. In some embodiments, the layered structure further comprises an epitaxial metal layer between the epi-twist rare-earth oxide layer and the RE-N layer.

BRIEF DESCRIPTION OF DRAWINGS

Further features of the disclosure, its nature and various advantages will be apparent upon consideration of the following detailed description, taken in conjunction with the accompanying drawings, in which.

DETAILED DESCRIPTION

Structures and methods described herein provide an electronic device with 2-dimensional electron gas (2DEG) between a polar-oriented rare-earth oxide layer on a semiconductor layer having non-polar or semi-polar orientation.

In some embodiments, surface atoms of non-polar or semi-polar oriented wurtzite semiconductors, such as III-N semiconductors in a form of $Al_xIn_yGa_{1-x-y}N$ ($0 \leq x, y \leq 1$) (e.g., GaN <1-100> or GaN <11-20> when x=y=0), are arranged in a pattern that may be suitable for growth of rare earth oxides (REO) <100> with off-plane orientation. In some embodiments, the <100> orientation of the REO layer may be polar. The polar orientation allows electrons from oxygen vacancies of the REO layer to diffuse to the III-N semiconductor (e.g., GaN) and form a 2-dimensional electron gas (2DEG) in the III-N semiconductor (e.g., GaN). An exemplary form of an REO with a polar <100> structure is $RE_2O_3$ (e.g. $Gd_2O_3$). In this way, 2DEG electronic or photonic devices may be formed in non-polar or semi-polar III-N semiconductors.

This opens-up a way for integration of electronic and photonic devices on the same substrate of non-polar or semi-polar III-N. Additionally, in some embodiments, the polar oriented REO may be used as a base for a gate of an electronic device. The polar orientation enhances the dielectric permittivity of the gate dielectric (dielectric constant (k) can reach k>20 vs k≈14) and therefore leads to increased efficiency in the electronic devices grown over the polar oriented REO layers.

Figure 1:
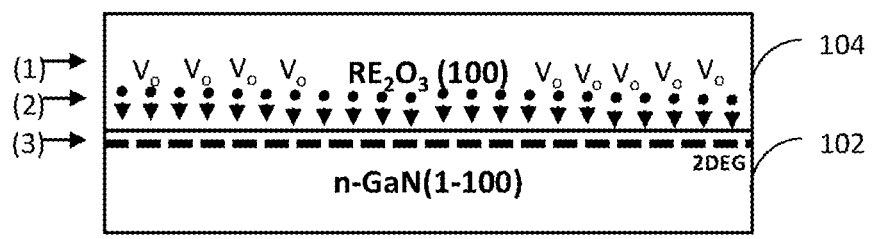
FIG. 1 shows an example diagram illustrating a layered structure that allows growth of polar-oriented REO <100> over a non-polar or semi-polar substrate, in accordance with an illustrative embodiment.

FIG. 1 shows an example diagram illustrating a layered structure that allows growth of polar-oriented REO <100> over a non-polar or semi-polar substrate, in accordance with an illustrative embodiment. Layered structure 100 in FIG. 1 includes a non-polar or semi-polar GaN <1-100> substrate 102. A polar oriented REO <100> 104 is grown over non-polar or semi-polar GaN <1-100> substrate 102. In some embodiments, polar oriented REO may have high surface energy. Due to the high surface energy, electrons from oxygen vacancies in a first region (1) of the polar REO 104, migrate to the interface at a second region (2) also in polar REO 104. The electrons from the interface at the second region (2) of the polar REO 104 are transferred to the semiconductor substrate 102 where they collect to form a confined 2-dimensional electron gas region (3). In this way, an n-type III-N 2DEG is formed on the non-polar or semi-polar substrate 102. In the case of a p-type substrate 102, the electrons that migrate to the non-polar or semi-polar substrate 102 from the REO 104 may recombine with holes in the non-polar or semi-polar substrate 102. In some embodiments, non-polar substrate 102 may be intrinsically doped, however the resulting concentration of electrons will be lower in 2DEG (3) of non-polar substrate 102.

In some embodiments, non-polar substrate 102 may include semiconductors with cubic structure REN, GaAs, SiGe or II-VI etc, which can be used to form the 2DEG in a similar manner as discussed in FIG. 1.

Figure 2:
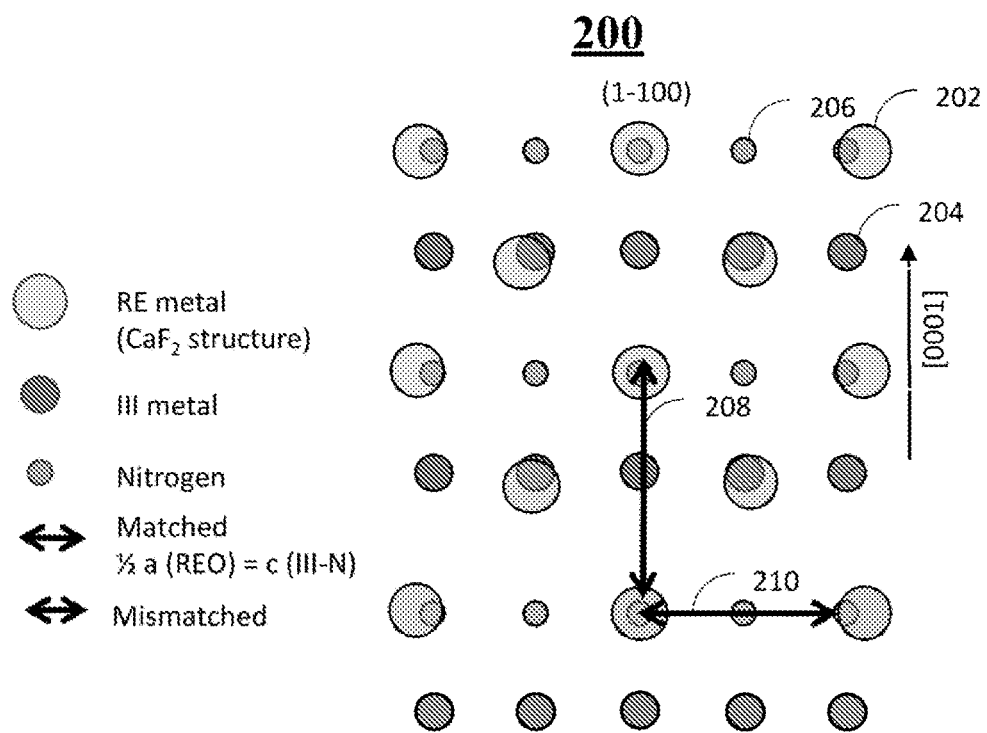
FIG. 2 shows an example diagram, that illustrates an arrangement of atoms of non-polar or semi-polar III-Ns that allows growth of polar-oriented REO, in accordance with an illustrative embodiment.
Figure 3:
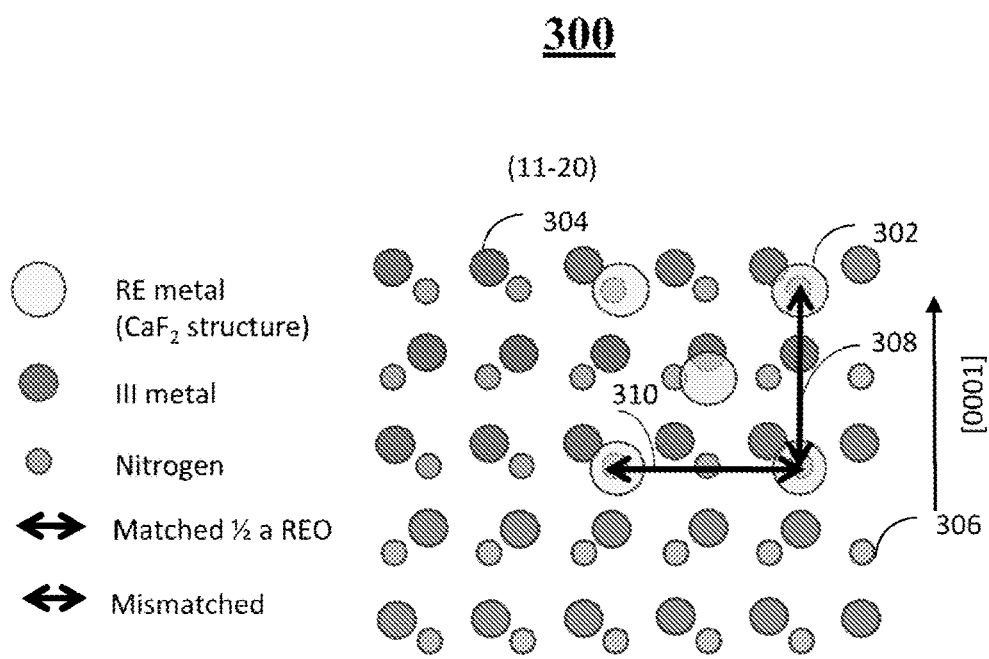
FIG. 3 shows an example diagram, that illustrates an arrangement of atoms of non-polar or semi-polar III-Ns that allows growth of polar-oriented REO, in accordance with an illustrative embodiment.

FIGS. 2-3 show atomic orientation of the non-polar or semi-polar substrates and the polar III-N layers grown over the non-polar or semi-polar substrates.

FIG. 2 shows an example diagram, that illustrates an arrangement of atoms of non-polar or semi-polar III-Ns that allows growth of polar-oriented REO, in accordance with an illustrative embodiment. Atoms arrangement on a non-polar III-N surface <1-100> and <11-20> may be similar to that of cubic structure of REO <100> surface. Non-polar or semi-polar III-N substrate (GaN) 102 in FIG. 2 has a <1-100> orientation, while the REO ($Gd_2O_3$) has a <100> orientation. Atomic arrangement 200 includes rare earth (RE) metal atoms (e.g., 202), III metal atoms (e.g., 204), and nitrogen atoms (e.g., 206). As depicted in atomic arrangement 200 of FIG. 2, rare earth metal atoms 202 are aligned with the nitrogen atoms 206 along the vertical axis as depicted by arrow 208. There is a minor mismatch in the structural alignment between the rare earth atoms 202 and the nitrogen atoms along the horizontal axis as depicted by arrow 210. In some embodiments, the mismatch may be introduced along the vertical axis instead of the horizontal axis. In some embodiments, there might be a slight mismatch along both the vertical axis and the horizontal axis. In some embodiments, there may be no mismatch along the vertical axis or the horizontal axis.

In some embodiments, polar-oriented REO <100> 104 may be grown over non-polar or semi-polar oriented <1-100> III-N substrate 102 because of the similar arrangement of atoms between the polar-orientated REO <100> 104 and non-polar oriented <1-100> III-N substrate 102. For example: (non-polar oriented <1-100> III-N substrate) GaN c=5.186 Å, (cubic polar-oriented REO <100>104) $Lu_2O_3$ ½ a=5.196 Å. In some embodiments, growth of cubic polar-orientated REO <100> 104 should be started with metal-first. In this way, RE metal atoms would be bound to N-atoms of non-polar oriented <1-100> III-N substrate 102.

FIG. 3 shows an example diagram, that illustrates an arrangement of atoms of non-polar or semi-polar III-N layers that allows growth of polar-oriented REO, in accordance with an illustrative embodiment. FIG. 3 is similar to FIG. 2 except that the orientation of the non-polar or semi-polar III-N substrate 102 has a <11-20> orientation. As depicted in atomic arrangement 300 of FIG. 3, rare earth metal atoms 302 are aligned with the nitrogen atoms 306 along the vertical axis as depicted by arrow 308. There is a minor mismatch in the structural alignment between the rare earth atoms 302 and the nitrogen atoms along the horizontal axis as depicted by arrow 310. In some embodiments, the mismatch may be introduced along the vertical axis instead of the horizontal axis. In some embodiments, there might be a slight mismatch along both the vertical axis and the horizontal axis. In some embodiments, there may be no mismatch along the vertical axis or the horizontal axis.

In some embodiments, cubic polar-oriented REO <100> 104 may be grown over non-polar oriented <11-20> III-N substrate 102 because of the similar arrangement of atoms between the cubic polar-orientated REO <100> 104 and non-polar oriented <11-20> III-N substrate 102. For example, a non-polar oriented <1-100> III-N substrate (e.g., GaN) may have an edge length of 5.186 Å, and polar-oriented REO <100> layer (e.g., $Lu_2O_3$) may have half an edge length of 5.196 Å. Therefore, the structure of the polar oriented REO <100> is double of the edge length of the non-polar III-N substrate <1-100>. Thus, the atoms of the two layers align and reduce mismatch between the two layers. In some embodiments, growth of cubic polar-orientated REO <100> 104 should be started with metal-first. In this way, RE metal atoms would be bound to N-atoms of non-polar oriented <11-20> III-N substrate 102.

Figure 4:
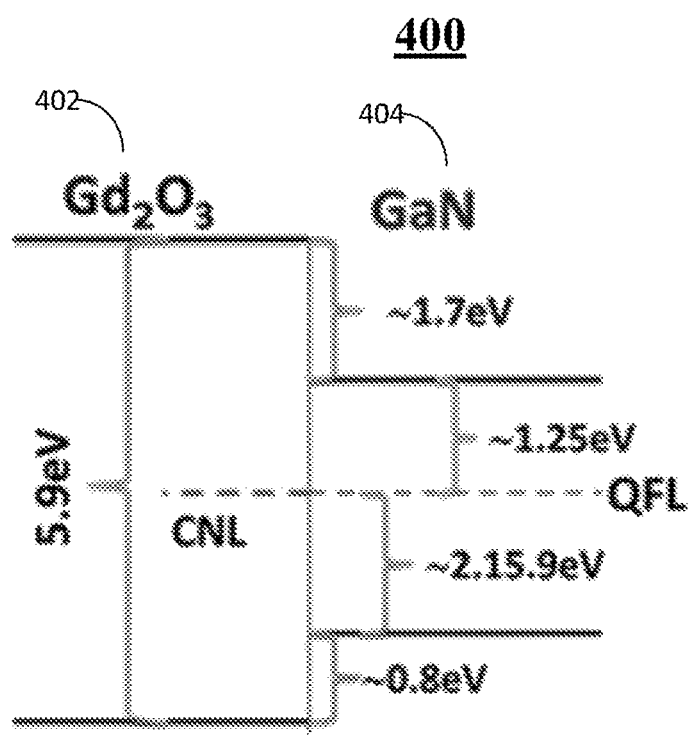
FIG. 4 shows an example diagram, that illustrates band offset between a rare earth oxide and a III-N semiconductor, in accordance with an illustrative embodiment.

FIG. 4 shows an example diagram, that illustrates band offset between a rare earth oxide and a III-N semiconductor, in accordance with an illustrative embodiment. FIG. 4 shows band energies of the polar rare-earth oxide ($Gd_2O_3$) 104 and the non-polar or semi-polar III-N semiconductor (GaN) 102 at 402 and 404 respectively. In some embodiments, the conduction band offset between polar REO 104 and III-N 102 is sufficient for electrons to diffuse from region (2) of polar REO 104 into III-N for formation of a 2DEG region (3). For example, band offset between $Gd_2O_3$ and GaN is approx. 1.7 eV. However, due to the potential barrier between the two layers, electrons cannot diffuse from (3) 2DEG in GaN layer 102 to interface (2) REO layer 104.

Figure 5:
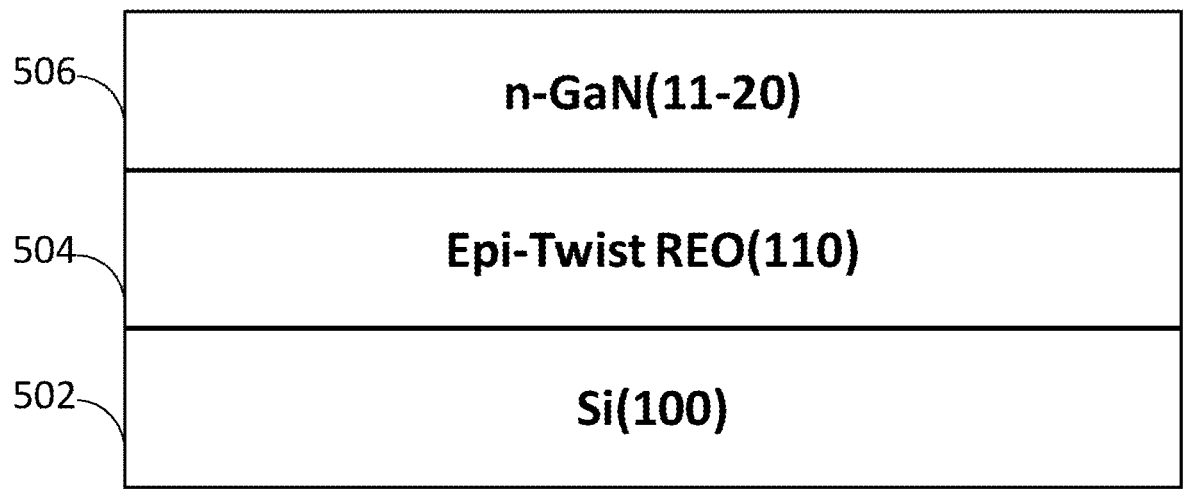
FIG. 5 shows an example diagram illustrating growing the layered structure of FIG. 1 over an epi-twist rare earth oxide over a silicon substrate, in accordance with an illustrative embodiment.

FIG. 5 shows an example diagram illustrating growing the layered structure of FIG. 1 over an epi-twist rare earth oxide over a silicon substrate, in accordance with an illustrative embodiment. Layered structure 500 in FIG. 5 includes a silicon substrate 502. An epi-twist rare earth oxide layer 504 is grown over the silicon substrate 502. A non-polar or semi-polar GaN <11-20> substrate 506 is grown over the epi-twist rare earth oxide layer 504. In some embodiments, the orientation of the epi-twist layer 504 is <110> and the orientation of the silicon substrate 502 is <100>. The non-polar or semi-polar GaN <11-20> substrate 506 may be used to grow a polar oriented REO <100> 104 as shown in FIG. 1.

Figure 6:
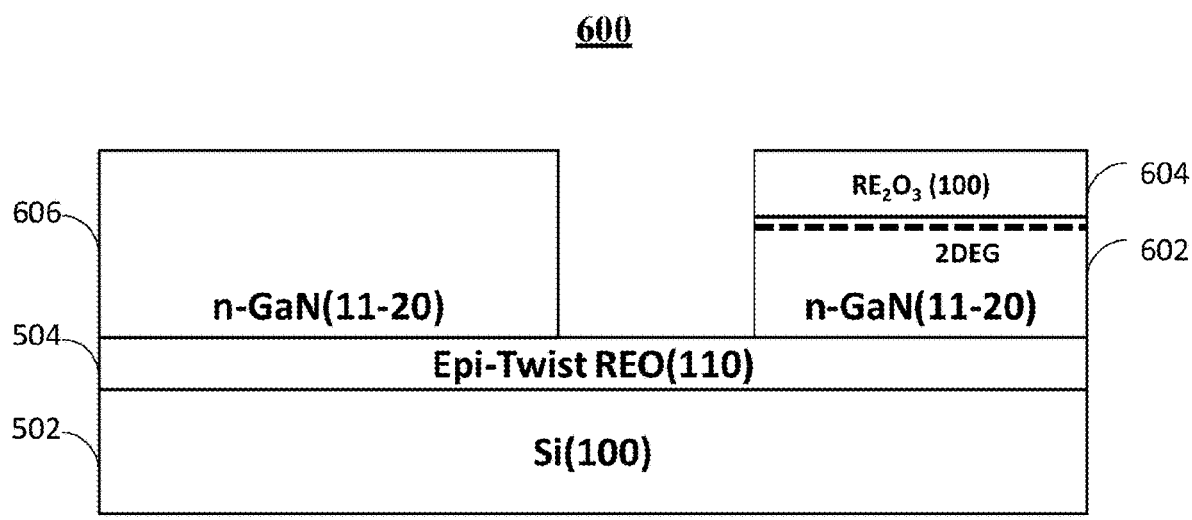
FIG. 6 shows an example diagram illustrating two non-overlapping discontinuous layers of a non-polar or semi-polar substrate over an epi-twist rare earth oxide over a silicon substrate, in accordance with an illustrative embodiment.

FIG. 6 shows an example diagram illustrating two non-overlapping discontinuous layers of a non-polar or semi-polar substrate over an epi-twist rare earth oxide over a silicon substrate, in accordance with an illustrative embodiment. Layered structure 600 includes a silicon substrate 502 and an epi-twist layer 504 grown over the silicon substrate 502. A first region of the epi-twist layer 504 has a first region 602 of non-polar or semi-polar GaN <11-20> grown over the epi-twist layer 504. The non-polar or semi-polar GaN <11-20> layer 602 may be used as a base to grow a polar REO layer 604 as shown in FIG. 1. A second region of the epi-twist layer 504 has a second region 606 of the non-polar GaN <11-20> that is grown over the epi-twist layer 504. The growth of the second region 606 allows for simultaneous growth of electronic and photonic devices on the same silicon substrate 502.

Figure 7:
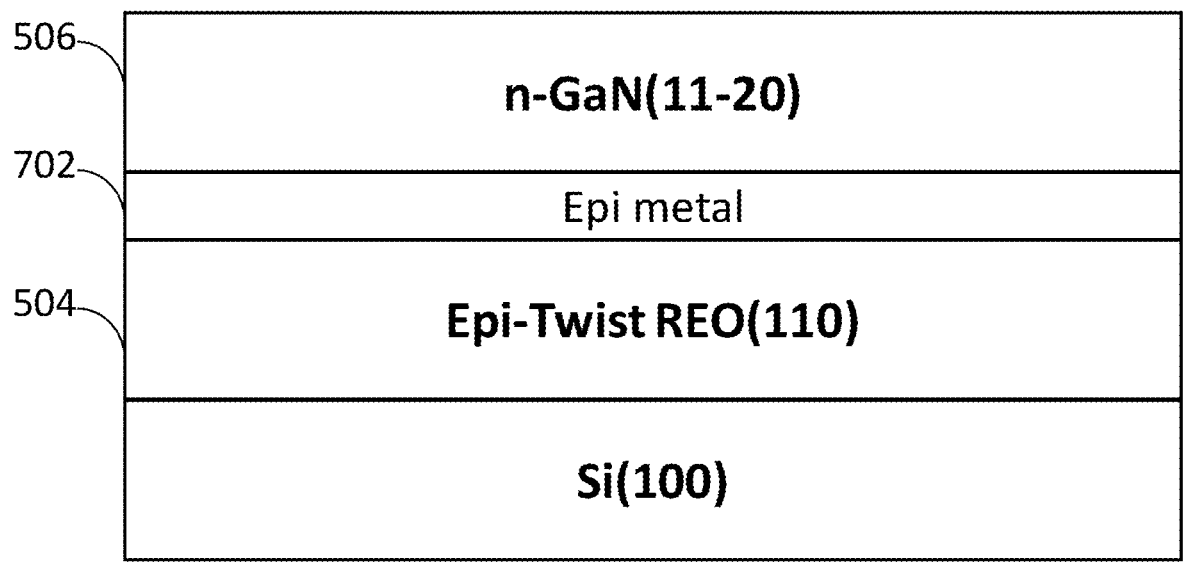
FIG. 7 shows an example diagram illustrating a layered structure of FIG. 1 over an epi-twist rare earth oxide over a silicon substrate with an intermediate epitaxial metal layer, in accordance with an illustrative embodiment.

FIG. 7 shows an example diagram illustrating a layered structure of FIG. 5 over an epi-twist rare earth oxide over a silicon substrate with an intermediate epitaxial metal layer, in accordance with an illustrative embodiment. Layered structure 700 in FIG. 7 is similar to layered structure 500 of FIG. 5, except that layered structure 700 includes an intermediate epitaxial layer 702 between the epi-twist layer 504 and the non-polar GaN <11-20> layer 506.

Figure 8:
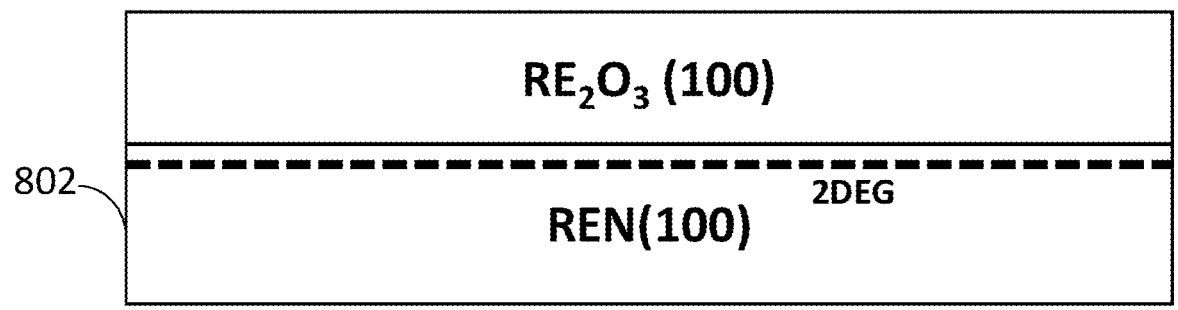
FIG. 8 shows an example diagram illustrating a layered structure that allows growth of polar-oriented REO <100> over a non-polar substrate.

FIG. 8 shows an example diagram illustrating a layered structure that allows growth of polar-oriented REN <100> over a non-polar or semi-polar substrate. Layered structure 800 in FIG. 8 is similar to the layered structure 100 of FIG. 1, except that layered structure 800 has a rare-earth nitride (REN) substrate 802 instead of a non-polar GaN <1-100> substrate 102. In some embodiments, rare-earth nitrides (for example, GdN) depending on stoichiometry are narrow band n-type semiconductors (GdN $E_g$=0.43 eV) or semi-metals. In some embodiments, REN layers have a cubic rock-salt structure and are non-polar in <100> orientation. In some embodiments, cubic polar-oriented REO <100> may be grown on a semiconductor REN as gate dielectric and form 2DEG device. In some embodiments, polar-oriented REO <100> may also be grown on <100> oriented semiconductors with cubic structure: group-IV, III-Vs, II-VIs.

Figure 9:
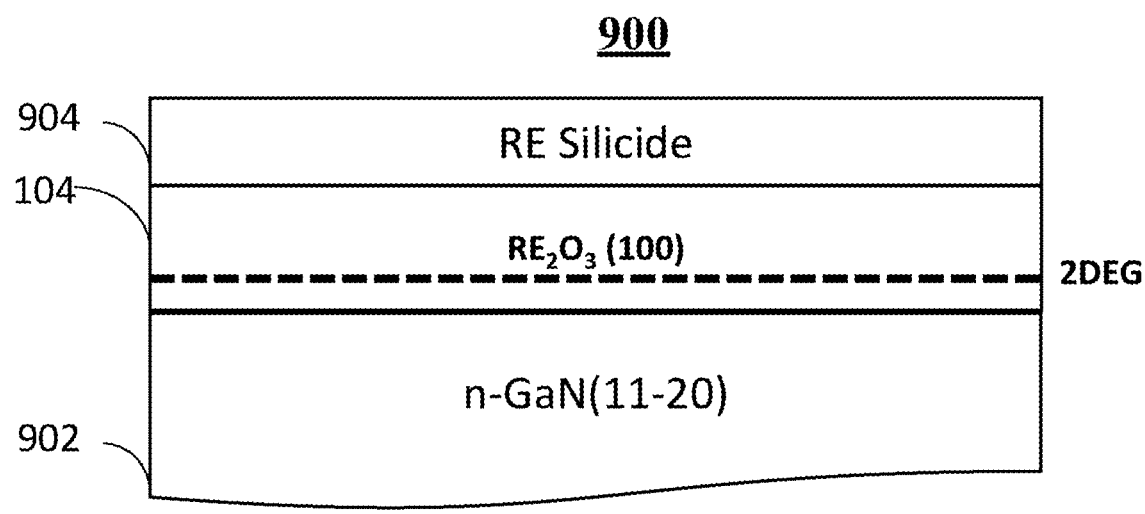
FIG. 9 depicts a layered structure that allows growth of a rare-earth silicide, over a polar-oriented REO <100>, that is grown over a non-polar substrate.
Figure 10:
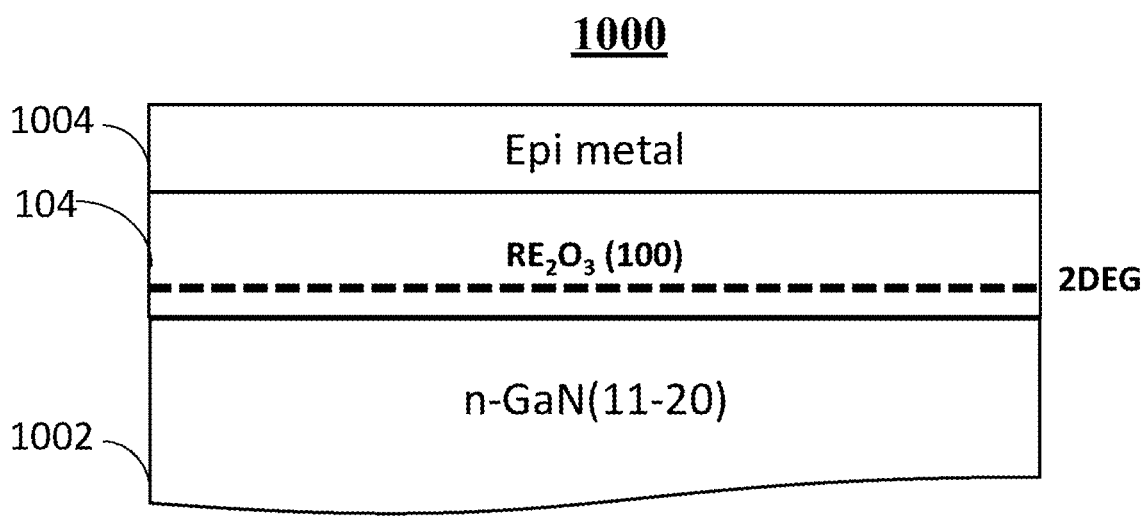
FIG. 10 depicts a layered structure that allows growth of an epitaxial metal layer over a polar-oriented REO <100>, that is grown over a non-polar or semi-polar substrate.

FIGS. 9 and 10 depict layered structures that allows growth of a rare-earth silicide, or an epitaxial metal layer over a polar-oriented REO <100>, that is grown over a non-polar or semi-polar substrate. FIG. 9 describes growing a rare-earth silicide layer 904 over the rare-earth oxide layer 104. The rare-earth oxide layer 104 is grown over the non-polar GaN <11-20> layer 902. FIG. 10 describes growing an epitaxial metal layer 1004 over the rare-earth oxide layer 104. The non-polar layer GaN <11-20> 902 or 1002 may be grown over any other substrate. Therefore, layered structures 900 and 1000 may be grown over a stack of layers.

Figure 11:
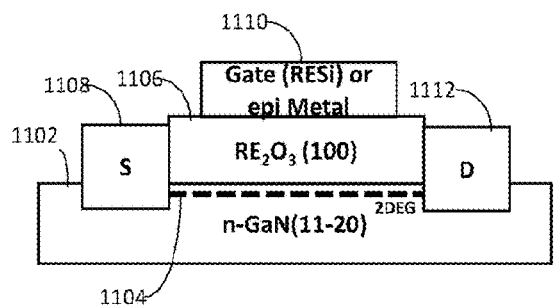
FIG. 11 depicts a layered structure of an exemplary 2DEG device on a non-polar or semi-polar substrate, in accordance with an illustrative embodiment.

FIG. 11 depicts a layered structure of an exemplary 2DEG device on a non-polar substrate, in accordance with an illustrative embodiment. Layered structure 1100 comprises a non-polar or semi-polar GaN (n-GaN) <11-20> 1102. The n-GaN <11-20> includes a 2DEG portion 1104. The 2DEG portion is created as described in FIGS. 1-4. Layered structure 1100 further comprises a polar rare earth oxide <100> 1106 over the n-GaN <11-20> substrate 1102. Source terminal 1108 and drain terminal 1112 of an exemplary device are integrated into substrate 1102. Gate terminal 1110 of the exemplary device is connected to polar rare earth oxide 1106. In some embodiments, the gate terminal 1110 may include a metal epitaxially grown over polar rare earth oxide 1106. In some embodiments, the gate terminal 1110 may include a rare earth silicide (RESi).

Figure 12:
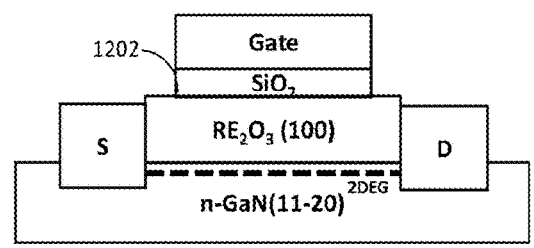
FIG. 12 depicts a layered structure of an exemplary 2DEG device on a non-polar or semi-polar substrate with an intermediate silicon dioxide layer, in accordance with an illustrative embodiment.

FIG. 12 depicts a layered structure of an exemplary 2DEG device on a non-polar substrate with an intermediate silicon dioxide layer, in accordance with an illustrative embodiment. FIG. 12 depicts a layered structure 1200 similar to layered structure 1100 FIG. 11, except FIG. 12 has an intermediate silicon dioxide ($SiO_2$) layer 1202 between polar rare earth oxide <100> layer 1106 and gate terminal 1110 of the exemplary device. In some embodiments, silicon dioxide layer 1202 is used to increase the width of the bandgap barrier between for electrons between rare earth oxide layer 1106 and n-GaN layer 1102. In such embodiments, the addition of the $SiO_2$ layer 1202 may increase the thickness of layered structure 1200 with respect to the thickness of layered structure 1100. The $SiO_2$ layer 1202 also has a larger bandgap (8.9 eV) than the REO layer 506 (5.9 eV).

Figure 13:
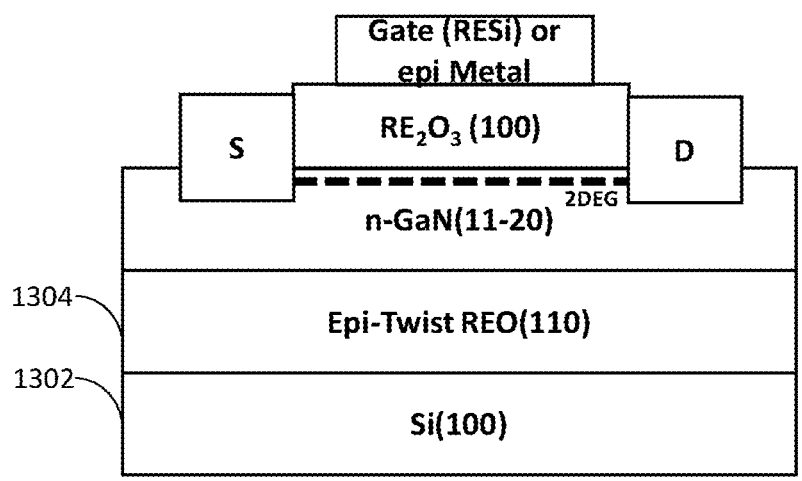
FIG. 13 depicts a layered structure of an exemplary 2DEG device on a non-polar or semi-polar substrate grown over an epi-twist rare earth oxide over a silicon substrate, in accordance with an illustrative embodiment.

FIG. 13 depicts a layered structure of an exemplary 2DEG device on a non-polar or semi-polar substrate grown over an epi-twist rare earth oxide over a silicon substrate, in accordance with an illustrative embodiment. FIG. 13 depicts a layered structure 1300 similar to layered structure 1100 of FIG. 11, except layered structure 1300 is grown over an epi-twist rare earth oxide <110> layer 1304 grown over silicon <100> substrate grown over 1302. Further detail relating to using epi-twist technology for growth of GaN on REO <110> over a Si <100> substrate can be found in greater detail in Dargis et. al., U.S. Pat. No. 8,846,504, issued Sep. 30, 2014, which is hereby incorporated by reference herein in its entirety.

Figure 14:
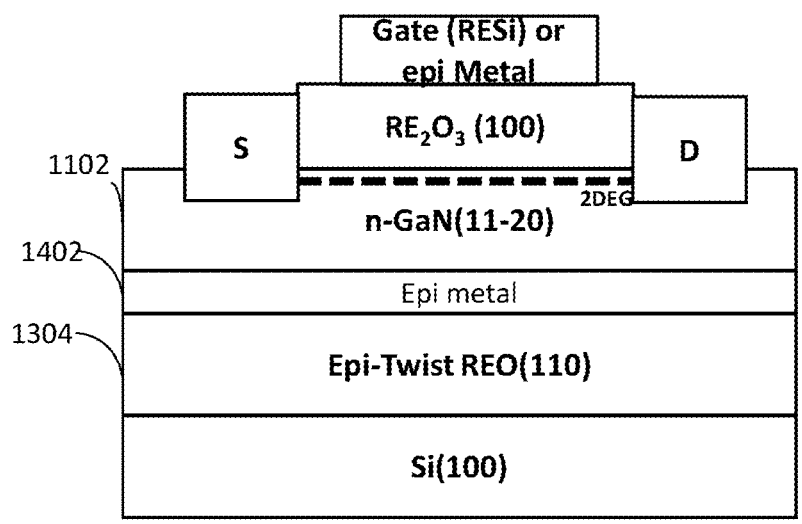
FIG. 14 depicts a layered structure of an exemplary 2DEG device on a non-polar or semi-polar substrate grown over an epi-twist rare earth oxide over a silicon substrate with an intermediate epitaxial metal layer, in accordance with an illustrative embodiment.

FIG. 14 depicts a layered structure of an exemplary 2DEG device on a non-polar or semi-polar substrate grown over an epi-twist rare earth oxide over a silicon substrate with an intermediate epitaxial metal layer, in accordance with an illustrative embodiment. FIG. 14 includes layered structure 1400 that is similar to layered structure 1300 of FIG. 13 except FIG. 14 includes an intermediate metal layer 1402 epitaxially grown over epi-twist REO layer 1304 and n-GaN <11-20> layer 1102.

Figure 15:
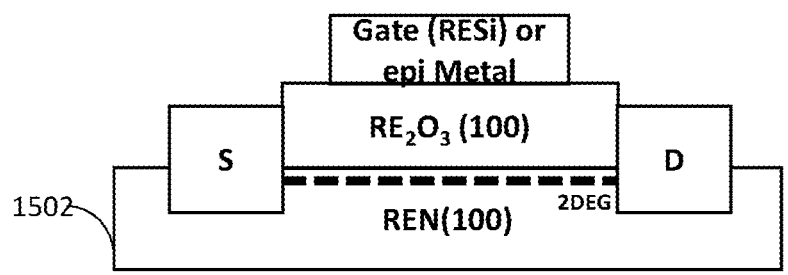
FIG. 15 depicts a layered structure of an exemplary 2DEG device on a non-polar or semi-polar substrate, in accordance with an illustrative embodiment.

FIG. 15 depicts a layered structure of an exemplary 2DEG device on a non-polar or semi-polar substrate, in accordance with an illustrative embodiment. FIG. 15 is similar to FIG. 11, except FIG. 15 depicts a different non-polar or semi-polar substrate 1502 that may be used instead of n-GaN <11-02> 1102. For example, substrate 1502 may include rare-earth nitrides (REN) (e.g., GdN) as they are a narrow energy band (e.g. 0.43 eV) n-type semiconductors. These substrates have a <100> orientation in the non-polar form that aligns with the <100> orientation of the rare-earth oxide layer over the substrate 1502. In some embodiment, polar-oriented REO <100> may also be grown on <100> oriented semiconductors with cubic structure, like semiconductors of the form group-IV, III-Vs, II-Vs.

Figure 16:
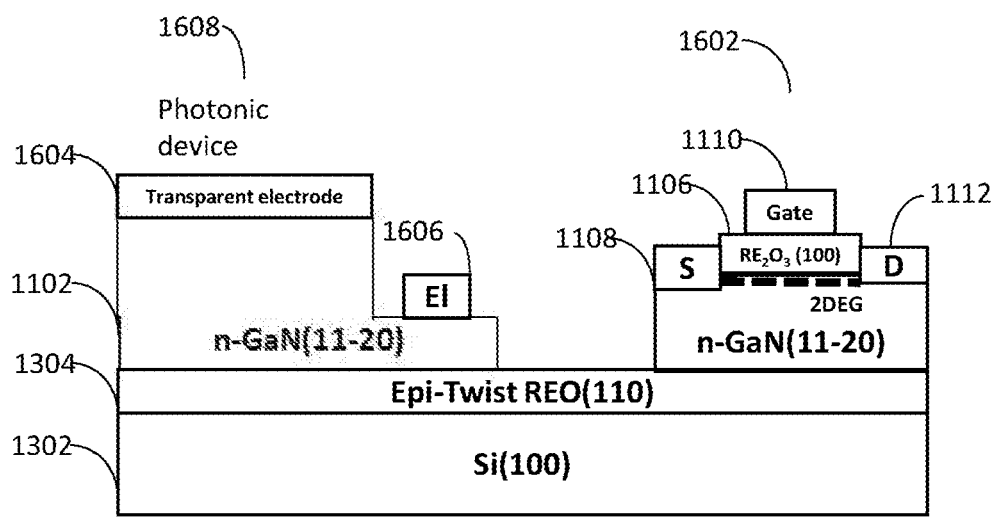
FIG. 16 depicts a layered structure illustrating mixed photonic and electronic structures that share a common epitaxial platform, according to an embodiment.

FIG. 16 depicts a layered structure illustrating mixed photonic and electronic structures that share a common epitaxial platform, according to an embodiment. Layered structure 1600 includes two non-overlapping layered structures grown over epi-twist layer 1204, that is in turn grown over a silicon <100> substrate 1202. A first region of epi-twist layer 1204 includes the exemplary 2DEG electronic device of layered structure 1000 (as shown in FIG. 10). A second region of epi-twist REO layer 1204 includes an exemplary layered structure 1508 of a photonic device. Photonic device structure 1508 includes a non-polar III-N semiconductor (n-GaN <11-20>) 1002 over the epi-twist REO layer 1204, a transparent electrode 1504 over a first portion of the n-GaN layer 1002, and an electrode layer 1506 over a second portion of the n-GaN <11-20> layer.

In some embodiments, absence of polarization fields in non-polar III-N (GaN <11-20>) semiconductors leads to an improvement in the efficiency of a photonic devices. In some embodiments, 2DEG regions in electronic devices (e.g. layered structure 1100) may be formed with non-polar III-Ns using polar REO <100> 1106 as a dielectric for gate terminal 1110. In such embodiments, stress may not be used to induce diffusion of electrons to form 2DEG in non-polar or semi-polar III-N semiconductors due to the absence of piezoelectric fields in non-polar or semi-polar III-Ns. Due to the lack of stress induced by non-polar III-N 1102 on a substrate, a photonic device 1608 and an electronic device 1602 may be formed on the same Si <100> substrate 1302, using epi-twist REO 1304.

Figure 17:
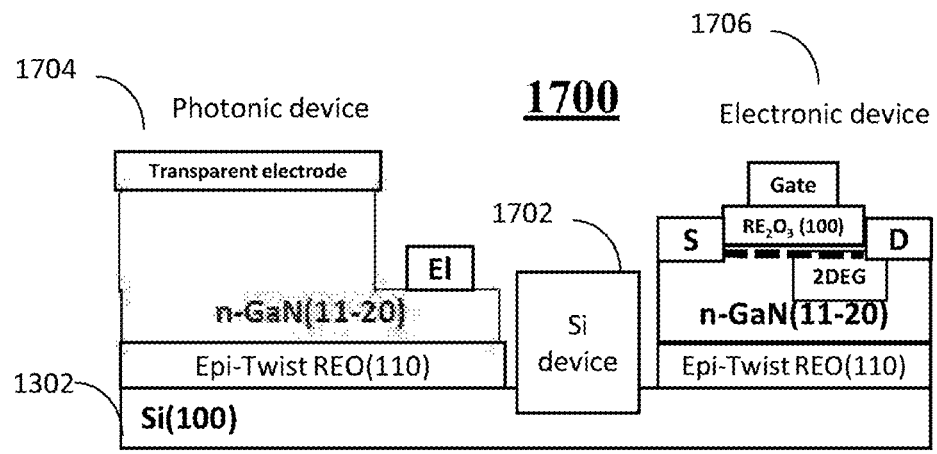
FIG. 17 depicts a layered structure that integrates Si based components with the photonic and electronic devices that share a common epitaxial platform, in accordance with an illustrative embodiment.
Figure 18:
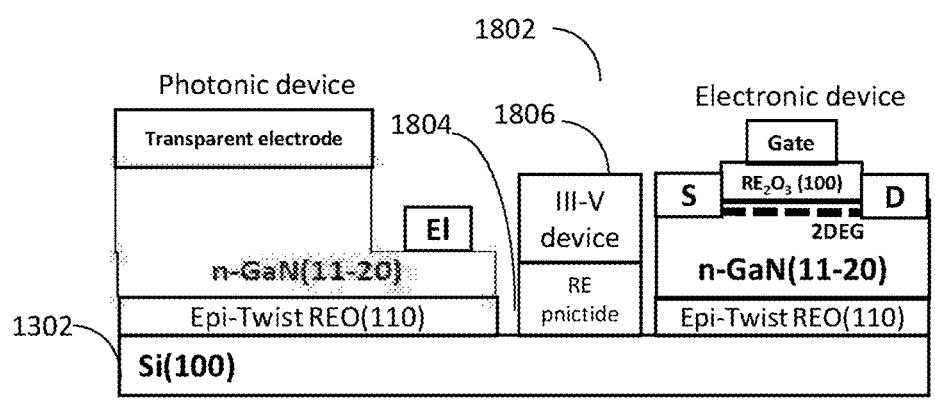
FIG. 18 depicts a layered structure that integrates pnictide based components with the photonic and electronic devices that share a common epitaxial platform, in accordance with an illustrative embodiment.

FIGS. 17 and 18 depict layered structures that integrate Si-based components with the photonic and electronic devices that share a common epitaxial platform, in accordance with an illustrative embodiment. The use of a Si <100> substrate helps to enable Si-based components to be used in conjunction with the III-N components (see 1700) and also allows for pnictides on the Si substrate as a buffer for III-V components (see 1800). Structures 1700 and 1800 are similar to FIG. 16, except FIGS. 17 and 18 include devices that are grown directly over a portion of the silicon substrate 1302.

Structure 1700 is similar to FIG. 16, except FIG. 17 includes a silicon device 1702 that is grown directly over silicon <100> substrate 1302 in a region that does not overlap the electronic device 1706 and the photonic device 1704.

Structure 1800 is similar to FIG. 16, except FIG. 18 includes a third non-overlapping structure 1802 over the silicon <100> substrate 1302. Layered structure 1802 includes a III-V device 1806 grown over a rare earth pnictide 1804 that acts as a buffer between the silicon substrate 1302 and the III-V device 1806.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially-uniform thickness of a material covering a surface. A layer may be either continuous or discontinuous (i.e., having gaps between regions of the material). For example, a layer may completely cover a surface, or be segmented into discrete regions, which collectively define the layer (i.e., regions formed using selective-area epitaxy).

An REO layer is a layer that contains one or more rare earths (REs) and oxygen. The rare earths include Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy). Holmium (Ho), Erbium (Er), Thulium (Tm), Ytterbium (Yb), Luthium (Lu), Scandium (Sc) and Yttrium (Y).

III-N materials include one or more species from Group III of the Periodic Table (such as B, Al, Ga, In, and Tl) and nitrogen. Examples of III-nitride materials include GaN, $In_xAl_yGa_{1-x-y}N$ ($0 \le x$, $y \le 1$), $Al_xGa_{1-x}N$ ($0 \le x \le 1$), $In_xAl_{1-x}N$ ($0 \le x \le 1$), InN, and/or AlN.

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. A substrate may have a single bulk wafer, or multiple sub-layers. Specifically, a substrate may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer includes silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a group III-nitride (III-N) layer, wherein the III-N layer has an orientation that is not polar; and
   a polar rare-earth oxide layer grown over the III-N layer,
   wherein the orientation of the III-N layer comprises an atomic arrangement such that a portion of rare-earth metal atoms of the polar rare-earth oxide layer are vertically aligned with nitrogen atoms of the III-N layer, and
   wherein the orientation of the III-N layer comprises a <1-100> orientation or a <11-20> orientation.

2. The layered structure of claim 1, wherein the orientation of the III-N layer is non-polar.

3. The layered structure of claim 1, wherein the orientation of the III-N layer is semi-polar.

4. The layered structure of claim 1, further comprising:
   a rare-earth silicide layer grown over the polar rare-earth oxide layer.

5. The layered structure of claim 1, further comprising:
   an epitaxial metal layer epitaxially grown over the polar rare-earth oxide layer.

6. The layered structure of claim 1, wherein the polar rare-earth oxide layer has at least a first portion of electrons that diffuse to an interface between the polar rare-earth oxide layer and the III-N layer or are transferred to the III-N layer to form an n-type 2-dimensional electron gas (2DEG) on the III-N layer.

7. The layered structure of claim 6, wherein the III-N layer and the polar rare-earth oxide layer are selected to yield a conduction band offset between the III-N layer and the polar rare-earth oxide layer that is sufficient for electrons to diffuse from the polar rare-earth oxide layer into the III-N layer.

8. The layered structure of claim 1, further comprising:
   a group IV substrate; and
   an epi-twist rare-earth oxide layer over the group IV substrate,
   wherein the III-N layer is over the epi-twist rare-earth oxide layer.

9. The layered structure of claim 8, further comprising:
   an epitaxial metal layer between the epi-twist rare-earth oxide layer and the III-N layer.

10. The layered structure of claim 1, wherein the III-N layer comprises gallium nitride.

11. A semiconductor device, comprising:
    a group III-nitride (III-N) layer, wherein the III-N layer has an orientation that is not polar;
    a polar rare-earth oxide layer grown over the III-N layer;
    a gate terminal deposited or grown over the polar rare-earth oxide layer;
    a source terminal that is deposited or epitaxially grown over the layer; and
    a drain terminal that is deposited or grown over the layer,
    wherein the orientation of the III-N layer comprises an atomic arrangement such that a portion of rare-earth metal atoms of the polar rare-earth oxide layer are vertically aligned with nitrogen atoms of the III-N layer, and
    wherein the orientation of the III-N layer comprises a <1-100> orientation or a <11-20> orientation.

12. The semiconductor device of claim 11, wherein the gate terminal comprises a rare-earth silicide or an epitaxial metal element.

13. The semiconductor device of claim 11, further comprising:
    a silicon dioxide layer between the polar rare-earth oxide layer and the gate terminal.

14. The semiconductor device of claim 11, further comprising:
    a silicon substrate; and
    an epi-twist rare-earth oxide layer over the silicon substrate,
    wherein the III-N layer is over the epi-twist rare-earth oxide layer.

15. The semiconductor device of claim 14, wherein the III-N layer aligns with a first region on the epi-twist rare-earth oxide layer, and the layered structure further comprises:
    a second III-N layer over a second region on the epi-twist rare-earth oxide layer, wherein the first region and the second region are non-overlapping;
    a transparent electrode over a first sub-region of the second III-N layer; and
    an electrode over a second sub-region of the III-N layer,
    wherein the second III-N layer, the transparent electrode, and the electrode form a photonic device.

16. The semiconductor device of claim 15, wherein the first region of the epi-twist rare-earth oxide layer and the second region of the epi-twist rare-earth oxide layer are discontinuous.

17. The semiconductor device of claim 16, further comprising:
    a silicon device integrated into the silicon substrate at a third region between the first region of the epi-twist rare-earth oxide layer and the second region of the epi-twist rare-earth oxide layer.

18. The semiconductor device of claim 17, further comprising:
    an element that comprises a rare-earth pnictide over the silicon substrate at the third region between the first region of the epi-twist rare-earth oxide layer and the second region of the epi-twist rare-earth oxide layer; and
    a III-N device over the rare-earth pnictide element.

19. A layered structure, comprising:
    a rare-earth-nitride (RE-N) layer, wherein the RE-N layer has an orientation that is not polar; and
    a polar rare-earth oxide layer grown over the RE-N layer,
    wherein the orientation of the RE-N layer comprises an atomic arrangement such that a portion of rare-earth metal atoms of the polar rare-earth oxide layer are vertically aligned with nitrogen atoms of the RE-N layer, and
    wherein the orientation of the RE-N layer comprises a <1-100> orientation or a <11-20> orientation.

20. The layered structure of claim 19, wherein the orientation of the RE-N layer is non-polar.

21. The layered structure of claim 19, wherein the orientation of the RE-N layer is semi-polar.

22. The layered structure of claim 19, further comprising:
a rare-earth silicide layer grown over the polar rare-earth oxide layer.

23. The layered structure of claim 19, further comprising:
an epitaxial metal layer epitaxially grown over the polar rare-earth oxide layer.

24. The layered structure of claim 19, wherein the polar rare-earth oxide layer has at least a first portion of electrons that diffuse to an interface between the polar rare-earth oxide layer and the RE-N layer or are transferred to the RE-N layer to form an n-type 2-dimensional electron gas (DEG) on the RE-N layer.

25. The layered structure of claim 24, wherein the RE-N layer and the polar rare-earth oxide layer are selected to yield a conduction band offset between the RE-N layer and the polar rare-earth oxide layer that is sufficient for electrons to diffuse from the polar rare-earth oxide layer into the RE-N layer.

26. The layered structure of claim 19, further comprising:
a group IV substrate; and
an epi-twist rare-earth oxide layer over the group IV substrate,
wherein the RE-N layer is over the epi-twist rare-earth oxide layer.

27. The layered structure of claim 26, further comprising:
an epitaxial metal layer between the epi-twist rare-earth oxide layer and the RE-N layer.

* * * * *